(12) United States Patent
Ohno et al.

(10) Patent No.: US 8,783,934 B2
(45) Date of Patent: Jul. 22, 2014

(54) SPREAD ILLUMINATING APPARATUS

(75) Inventors: Yasuo Ohno, Kitasaku-gun (JP); Masahisa Nishio, Kitasaku-gun (JP)

(73) Assignee: Minebea Co., Ltd., Nagano (JP)

( * ) Notice: Subject to any disclaimer, the term of this patent is extended or adjusted under 35 U.S.C. 154(b) by 120 days.

(21) Appl. No.: 13/431,515

(22) Filed: Mar. 27, 2012

(65) Prior Publication Data

US 2012/0262944 A1 Oct. 18, 2012

(30) Foreign Application Priority Data

Apr. 18, 2011 (JP) ................... 2011-092048

(51) Int. Cl.
*F21V 7/04* (2006.01)
(52) U.S. Cl.
USPC ........... 362/630; 362/611; 362/612; 362/613; 362/631
(58) Field of Classification Search
USPC ................................ 362/600–634
See application file for complete search history.

(56) References Cited

U.S. PATENT DOCUMENTS

| 7,140,751 | B2 * | 11/2006 | Lin ............................. | 362/800 |
| 2011/0075443 | A1 * | 3/2011 | Huang et al. ................ | 362/606 |

FOREIGN PATENT DOCUMENTS

JP   A-2006-286347   10/2006

* cited by examiner

*Primary Examiner* — William Carter
(74) *Attorney, Agent, or Firm* — Oliff PLC

(57) ABSTRACT

A sidelight type spread illuminating apparatus includes a light guiding plate; a plurality of circuit boards arranged so as to face a side end face of the light guiding plate; a light source mounted on the circuit boards; and a connector that electrically connects the circuit boards adjacent to each other. The connector includes a socket and a plug that are removable therebetween. The socket and the plug are configured to be removable in a direction parallel to each mounting surface of the light sources of the circuit boards in a state that either the socket or the plug is fixed to ends of the circuit boards adjacent to each other.

8 Claims, 3 Drawing Sheets

F I G. 1A
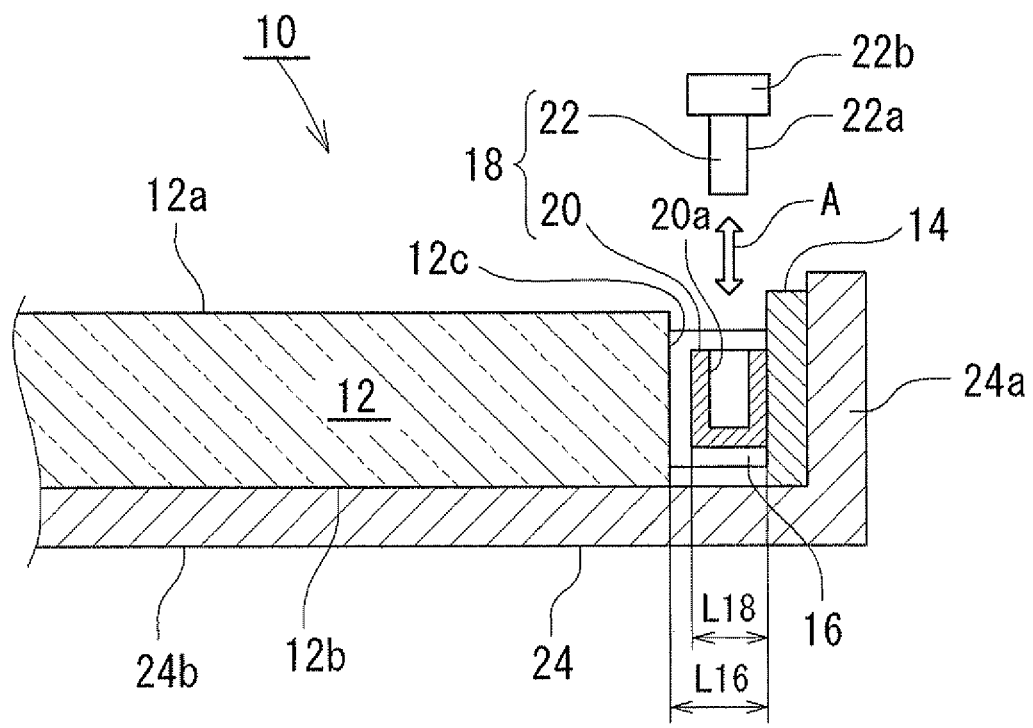
F I G. 1B
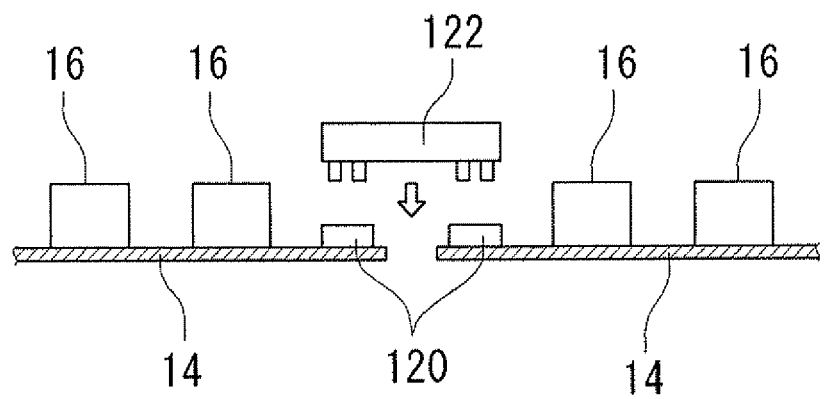

SPREAD ILLUMINATING APPARATUS

BACKGROUND OF THE INVENTION

1. Field of the Invention

The present invention relates to a spread illuminating apparatus.

2. Description of the Related Art

Along with the high performance of recent blue light-emitting diodes (LED), a spread illuminating apparatus, to which LEDs are applied as a light source, has been widely used not only for the backlight of a large flat-screen television but also for the lighting device of an indoor lighting.

A generally known structure of the spread illuminating apparatus is a so-called sidelight type. This type includes a light guiding plate that forms a light emitting surface, LEDs that are arranged to face a side end face of the light guiding plate, and a circuit board on which the LEDs are mounted. FIG. 4 schematically illustrates this type of spread illuminating apparatus. The basic structure of a sidelight type spread illuminating apparatus 100 includes a light guiding plate 101, a plurality of LEDs 102 that are arranged to face a side end face (light incident surface) 101c of the light guiding plate 101, and a circuit board 104 on which the LEDs 102 are mounted, the circuit board 104 facing the light incident surface 101c of the light guiding plate 101. The light guiding plate 101 is a plate-like light guiding body which is made of a transparent resin material such as methacrylic resin or polycarbonate resin. In FIG. 4, an emission surface 101a, which is one principal surface of the light guiding plate 101, is provided with triangular prisms of the same shape in which to be arranged at equal intervals, each extending in a direction orthogonal to the light incident surface 101c. A reflection surface 101b, which is the other principal surface facing the emission surface 101a, is provided with a diffuse reflection means or a specular reflection means, either means being adapted to reflect light that has been incident on the reflection surface 101b. Accordingly, at least a part of the reflected light is introduced into the emission surface 101a at an incidence angle equal to or smaller than a critical angle.

In FIG. 4, a prism sheet 103 is disposed over the emission surface 101a of the light guiding plate 101. The prism sheet 103 is a sheet member made of a transparent resin material such as a PET film. At a principal surface 103a of the prism sheet 103, triangular prisms are provided with multiple rows extending in one direction, the prisms being made of a methacrylic resin or a polycarbonate resin. The principal surface 103a of the prism sheet 103 is disposed to face the emission surface 101a of the light guiding plate 101. Accordingly, the extension direction of prisms on the prism sheet 103 will be orthogonal to the extension direction of prisms of the light guiding plate 101.

Here, although not illustrated in FIG. 4, a reflection plate may be provided to the LED 102, or to a portion just below the light guiding plate 101. Further, it has been generally known that the sidelight type spread illuminating apparatus is integrally configurable into a single unit with a frame by enclosing components therein (refer to Japanese Patent Application Laid-Open No. 2006-286347).

When the sidelight type spread illuminating apparatus is applied as the backlight of light flat-screen televisions or lighting devices for indoor lighting, the plurality of LEDs needs to be arranged along the light incident surface 101c of the relatively large sized light guiding plate 101 in order to achieve sufficient luminance properties needed. Thus, the circuit board 104, on which the LEDs 102 are mounted, should be necessarily sizable. However, it is practically difficult to make the circuit board 104 large enough to correspond to the size of the light guiding plate 101 due to restriction factors such as an LED mounting apparatus or an available reflow size. Accordingly, at present, for the circuit board to be applied to large-sized spread illuminating apparatuses, a number of circuit boards, each manufacturable by present or conventional manufacturing devices, will be typically connected to each other.

However, when existing connectors are used as a connecting means of the circuit boards, available connectors are to be narrowed in handling of other components. Accordingly, some types of the circuit boards may not be connected with the existing connectors. There is an alternative method which uses wire rather than using the connector for connecting the circuit boards. However, connection works without using the connector will be further complicated.

SUMMARY OF THE INVENTION

The present invention has been made in light of the above problems and it is an object of the present invention to provide a spread illuminating apparatus that allows flexibly increasing the size of a circuit board that composes the spread illuminating apparatus by connecting small circuit boards, and facilitating the work of connecting the small circuit boards.

The following aspects of the invention are provided to demonstrate the structures of the present invention. The aspects are separately presented to help ones to easily understand various structures of the present invention. Each aspect should not be construed to limit a technical scope of the present invention. Furthermore, replacement or elimination of elements of each configuration or addition of elements other than the described ones to each configuration of the embodiments for implementing the invention may also fall within the technical scope of the invention.

In order to achieve the object describe above, according to a first aspect of the present invention, there is provided a sidelight type spread illuminating apparatus comprising: a light guiding plate; a plurality of circuit boards arranged so as to face a side end face of the light guiding plate; a light source mounted on the circuit boards; and a connector that electrically connects the circuit boards adjacent to each other, wherein the connector includes a socket and a plug that are removable therebetween, and the socket and the plug are configured to be removable in a direction parallel to each mounting surface of the light sources of the circuit boards in a state that either the socket or the plug is fixed to ends of the circuit boards adjacent to each other.

With the above structure, the spread illuminating apparatus is configured to be suitable for the backlights of a large flat-screen television and a lighting device for indoor lightings because the plurality of circuit boards, on which the light sources are mounted, are arranged so as to face the side end face of the light guiding plate. The plurality of circuit boards are configured as that each of the circuit boards adjacent to each other is electrically connected with the connector. The connector includes the socket and the plug that are removable therebetween. In use, either the socket or the plug is fixed to the adjacent ends of the neighboring circuit boards. The socket and the plug have the removable structure in which to allow connection and disconnection in a direction parallel to the mounting surface of the circuit board on which the light source is arranged. Accordingly, in a region sandwiched between the side end face of the light guiding plate and the circuit board, the above removable work between the socket and the plug is allowed making the plurality of circuit boards to be able to connect or disconnect therebetween.

In the first aspect of the present invention, the spread illuminating apparatus further comprising: a frame that is configured to house the light guiding plate and the circuit boards and that has a sidewall parallel to the side end face of the light guiding plate, wherein the circuit boards are arranged and fixed to the sidewall of the frame.

With the above structure, the spread illuminating apparatus is integrated into a single body by means of the frame which houses the light guiding plate and the circuit boards. In a condition that each of the circuit boards is arranged on and fixed to the sidewall of the frame parallel to the side end face of the light guiding plate, the socket and the plug are configured to be removable in a direction parallel to the mounting surface of the circuit board on which the light source is arranged. Accordingly, in a region sandwiched between the side end face of the light guiding plate and the circuit boards, the plurality of circuit boards are allowed to connect or disconnect therebetween.

In the first aspect of the present invention, the frame has at least two sidewalls that face to each other, the frame thus being in a U-shaped cross-section, and either the socket or the plug is fixed to the circuit boards so as to make a removable direction of the socket and the plug headable toward an opening side of the frame.

With the above structure, the frame has at least two sidewalls facing to each other. The frame is thus configured to have the U-shaped cross-section. Each of the circuit boards is fixed to the sidewalls of the frame in such as manner that the removable direction of the socket and the plug is directed toward the opening side of the frame 24. In a region sandwiched between the side end face of the light guiding plate and the circuit board, the socket and the plug are configured to be removable in the opening side of the frame. The removable work between the socket and the plug are performable in a direction parallel to the mounting surface of the circuit board on which the light source is arranged. The plurality of circuit boards are allowed to connect or disconnect therebetween.

In the first aspect of the present invention, a pair of sockets are fixed to the ends of the circuit boards adjacent to each other; a pair of plugs are mounted to the pair of sockets, each of the plugs including a terminal electrically connected to an electrode of each socket, a plug body holding each of the terminals, and a connecting portion electrically connecting each of the terminals held in the plug body.

With the above structure, the pair of sockets are fixed to each end of the plurality of circuit boards adjacent to each other. On the other hand, the pair of plugs are installed into the pair of sockets. Here, each of the pair of plugs includes terminals electrically connected to the electrode of the socket, and the plug body which holds the terminals. The terminal held in the plug body is electrically connected by means of the connecting portion.

Further, when the circuit boards are fixed to the sidewall of the frame having the U-shaped cross-section, and when the removable direction of the socket and the plug is directed toward the opening side of the frame, the socket and the plug of one side will first conduct the removable work in the opening side of the frame. The socket and the plug of the other side will then conduct the removable work in the same opening side. Accordingly, in a region sandwiched between the side end face of the light guiding plate and the circuit board, the circuit boards adjacent to each other can electrically connect or disconnect therebetween.

In the first aspect of the present invention, the connecting portion is configured to have a certain length to make an interval between each of the pair of plugs to correspondent to an interval between each of the pair of sockets fixed to the ends of the circuit boards adjacent to each other.

With the above structure, the connecting portion has a specified length of that the interval between each of the plugs will correspond to the interval between each of the sockets.

Further, when the circuit boards are fixed to the sidewall of the frame in such a manner as to head the removable direction of the socket and the plug toward the opening side of the frame having the U-shaped cross-section, the removable work between the socket and the plug is performed in a region sandwiched between the side end face of the light guiding plate and the circuit board (that is, in the opening side of the frame), the removable work being conducted in a direction parallel to the mounting surface of the circuit board on which the light source is arranged. Here, in a condition where the socket and the plug on one side are connected, the removable work between the socket and the plug on the other side (especially positioning between the socket and the plug to be connected) will be performed. Since the connecting portion has a specified length as discussed hereinabove, the positioning of the socket and the plug can be performed with no mistake.

In the first aspect of the present invention, the connecting portion is configured to have flexibility.

With the above structure, since the connecting portion is flexible, the electrical connection of the adjacent circuit boards is secured, regardless of how to arrange the socket. The connecting portion is thus allowed to cope with variously arranged angles, thereby being able to facilitate the connection work between the socket and the plug.

In the first aspect of the present invention, the socket includes: a concave portion that opens toward the outside of the circuit board and is fitted with the terminal of the plug; and the electrode that is exposed in the concave portion.

With the above structure, by fitting the terminal of the plug into the concave portion of the socket, the terminal of the plug and the electrode of the socket will contact to each other so as to electrically connect therebetween.

When the circuit boards are fixed to the sidewall of the frame in such a manner as to head the removable direction of the socket and the plug toward the opening side of the frame having the U-shaped cross-section, the removable work between the terminal of the plug relative to the concave portion of the socket is performed in a region sandwiched between the side end face of the light guiding plate and the circuit board (that is, in the opening side of the frame).

In the first aspect of the present invention, the connector is arranged on a mounting surface side of the circuit board on which the light source is arranged, and an optical axis length of the connector is configured to be smaller than an optical axis length of the light source.

With the above structure, the connector is arranged on the mounting surface side of the circuit board on which the light source is mounted. Further, the length of the connector in its optical axis direction is made smaller than the length of the light source in its optical axis direction. Accordingly, with no interference from the connector, it is possible that the light source mounted on the circuit boards can be closely arranged relative to the side end face of the light guiding plate. Light incidence efficiency of the light emitted from the light source with respect to the light guiding plate can be improved. Still further, the region sandwiched between the side end face of the light guiding plate and the circuit board can be effectively used for a place in which the connector is arranged.

Since the present invention has the above structure, it is possible that the total size of the circuit board constituting the spread illuminating apparatus freely increases by connecting several small circuit boards. Connection works between each of the circuit boards can also be facilitated by applying the present invention.

BRIEF DESCRIPTION OF THE DRAWINGS

FIG. 1A is a cross-sectional view illustrating the periphery of a connector that electrically connects adjacent circuit boards of a spread illuminating apparatus according to an embodiment of the present invention;

FIG. 1B is a diagram illustrating the periphery of a connector that electrically connects adjacent circuit boards in case of a comparative example where the connector with a different structure is applied;

DETAILED DESCRIPTION OF THE PREFERRED EMBODIMENTS

Figure 2:
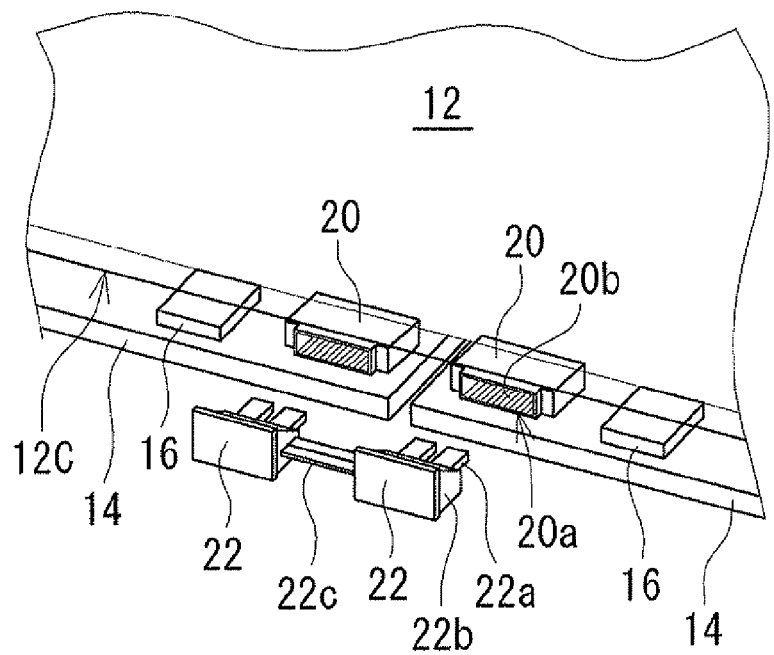
FIG. 2 is a perspective view illustrating the periphery of the connector that electrically connects the adjacent circuit boards of the spread illuminating apparatus according to the embodiment of the present invention.

Hereinafter, some embodiments of the present invention will be described with reference to the attached drawings. In this case, the same or corresponding components with conventional arts will be denoted by the same reference numerals, and detail description thereto will be omitted.

As illustrated in FIG. 1A, a spread illuminating apparatus 10 according to an embodiment of the present invention is the sidelight type spread illuminating apparatus that includes: a light guiding plate 12; a plurality of circuit boards 14 that are arranged along a longitudinal direction of a light incident surface 12c thereby facing the side end face (light incident surface) 12c of the light guiding plate 12; and a plurality of light sources (LEDs) 16 that are mounted on the circuit boards 14 and are arranged so as to face the light incident surface 12c of the light guiding plate 12. In addition, the spread illuminating apparatus 10 includes a connector 18 that electrically connects the adjacent circuit boards 14 and 14. The connector 18 includes a socket 20 and a plug 22 which can be freely removable therebetween.

In an illustrated example, the configuration of the light guiding plate 12 in a plane view is a rectangle defined by 600 mm×600 mm. As stated, the socket 20 and the plug 22 have the removable structure as that both members are removable in a direction parallel to the mounting surface of the LED 16 of the circuit board 14 ("A" direction in FIG. 1A) when each socket 20 is fixed to the adjacent end of the circuit board 14. In the drawings, reference numeral 12a denotes an emission surface, reference numeral 12b denotes a reflection surface, and reference numeral 12c denotes a light incident surface. The circuit board 14 has a rectangular bar shape of 300 mm×6 mm and is made of aluminum or Frame Retardant Type 4 (FR4).

The spread illuminating apparatus includes a frame 24 that has a sidewall 24a arranged parallel relative to the light incident surface 12c of the light guiding plate 12 so as to house the light guiding plate 12 and the circuit board 14. The circuit boards 14 are fixed to the sidewall 24a of the frame 24. The height of the sidewall 24a of the frame 24 is equal to or less than 10 mm. Here, as a means to fix the circuit board 14 to the sidewall 24a of the frame 24, a double-sided tape may be applied.

The illustrated frame 24 has a U-shaped cross-section that has the pair of sidewalls 24a facing to each other. However, for convenience, only the peripheral portion of the circuit board 14 and the connector 18 is illustrated. Here, the frame 24 may have its top fully opened with the sidewalls 24a formed on all end faces thereof. On the other hand, the frame 24 may have the sidewall 24a at only one face thereof. According to the need, an opening may have at a bottom portion 24b of the frame 24. In addition, the bottom portion 24b may be configured to have a frame shape. In this embodiment, the frame 24 is made of an aluminum plate. However, the frame 24 may be made of a resin material, or a composite structure between a plate and resin.

In FIG. 2, the pair of sockets 20 and 20 are fixed to the adjacent ends of the circuit board 14. The pair of plugs 22 and 22 that are each mounted to the pair of sockets 20 and 20 are configured with: terminals 22a electrically connected to terminals of each socket 20; a plug body 22b holding the terminals 22a, and a connecting portion 22c that electrically connects between the terminals held by the plug body 22b. The terminal 22a is a metallic terminal while the plug body 22b is made of insulating materials such as resin. The connecting portion 22c is a metallic wire. The connection portion 22c has a certain length of that an interval between each of the plugs 22 and 22 is correspondent with an interval between each of the sockets 20 and 20 fixed to the adjacent ends of the circuit boards 14 and 14.

Each socket 20 has a concave portion 20a which opens toward the outside of the circuit board 14 and is fitted into a terminal 22a of the plug 22. The socket 20 also has an electrode 20b that is exposed in the concave portion. The socket 20 is made of insulating materials such as resin, similar to the plug body 22b.

As illustrated in FIG. 1, the socket 20 is fixed on the circuit board 14 in such a manner that the opening of the concave portion 20a of the socket 20 is directed toward the opening side (upper side of FIG. 1A) of the frame 14. The connector 18 is disposed on the side of a mounting surface of the circuit board 14 on which the light source 16 is mounted. The connector 18 is configured as that the length L18 of the connector 18 in an optical axis direction is smaller than the length L16 of the light source 16 in an optical axis direction when the socket 20 and the plug 22 are connected to each other.

According to the embodiments of the present invention based hereon above, the following functional effects are obtainable.

That is, in the spread illuminating apparatus 10 according to the embodiments of the present invention, the plurality of circuit boards 14, on which the LEDs 16 are mounted, are arranged in such a manner as to face the light incident surface 12c of the light guiding plate 12. Accordingly, the spread illuminating apparatus 10 will be suitable for the backlight of a large flat-screen television, or for the lighting devices of an indoor lighting. Further, in the plurality of circuit boards 14, each of the adjacent circuit boards 14 is electrically connected through the connector 18. The connector 18 includes the socket 20 and the plug 22 that are freely removable therebetween. The socket 20 is adapted to be fixed to each adjacent end of the circuit board 14. Since the socket 20 and the plug 22 have the removable structure allowing these members being removable in a direction parallel to the mounting surface of the LED 16 of the circuit board 14 ("A" direction in FIG. 1), the removable work of the plug 22 will be allowed in a region sandwiched between the light incident surface 12c of the light guiding plate 12 and the circuit board 14 in a direction parallel to the mounting surface of the LED 16 of the circuit board 14. Accordingly, the plurality of circuit boards 14 will be removable with ease.

The spread illuminating apparatus 10 can be unitized by means of the frame 24 so as to house the light guiding plate 12 and the circuit board 14. When the circuit boards 14 are fixed to the sidewall 24a of the frame 24 in a direction parallel to the light incident surface 12c of the light guiding plate 12, the removable work of the plug 22 will be allowed in a region sandwiched between the light incident surface 12c of the light guiding plate 12 and the circuit board 14 in a direction parallel to the mounting surface of the LED 16 of the circuit board 14. The plurality of circuit boards 14 will be thus removable with ease.

The frame 24 has the U-shaped cross-section where at least the pair of sidewalls 24a are provided in a manner faced to each other. The circuit board 14 is fixed to the sidewall 24a of the frame 24 in such a manner as to direct the removable direction of the plug 22 toward the opening side of the frame 24. Accordingly, the removable work of the plug 22 from the opening side of the frame 24 will be allowed in a region sandwiched between the light incident surface 12c of the light guiding plate 12 and the circuit board 14 in a direction parallel to the mounting surface of the LED 16 of the circuit board 14. The plurality of circuit boards 14 will be thus removable with ease.

Thus, considering a conventional connector as illustrated in FIG. 1B, a removable work between sockets 120, 120 and a plug 122 has been conducted in a direction orthogonal to the mounting surface of the LED 16 of the circuit board 14. In this structure, the removable work between the sockets 120, 120 and the plug 122 are not allowed while the light guiding plate 12 is arranged. On the other hand, the embodiments of the present invention allow easy performance of the removable work between sockets 120, 120 and the plug 122 even in a condition that the light guiding plate 12 has been arranged. Further, it is also allowed that each individual circuit board 14 is removed from the spread illuminating apparatus 10 for maintenance or exchange purposes.

In the embodiments of the present invention, the pair of sockets 20 and 20 are fixed to each end of the plurality of circuit boards 14 and 14 adjacent to each other. Each individual plug 22 of the pair of plugs 22 and 22 has the terminal 22a electrically connected to the electrode 20b of the socket 20, and the plug body 22b holding the terminals 22a. The connecting portion 22c then electrically connect between the terminals 22a held by the plug body 22b.

In order to head the removable direction of the socket 20 and the plug 22 toward the opening side of the frame 24 with the U-shaped cross-section, the circuit boards 14 are fixed to the sidewall 24a of the frame 24. In a region sandwiched between the light incident surface 12c of the light guiding plate 12 and the circuit board 14, the removable work of the socket 20 and the plug 22 on one side will be performed from the opening side of the frame 24. Subsequently, the removable work of the socket 20 and the plug 22 on the other side will be also performed. Accordingly, an electrical connection or disconnection between the circuit boards 14 and 14 adjacent to each other will be performable.

The length defined between each of the plugs 22, 22 that is connected by the connecting portion 22c is correspondent to the interval defined between each of the sockets 20, 20 fixed to each end of the plurality of circuit boards 14 and 14 adjacent to each other. Since the positioning of the plug 22 relative to the socket 20 is determinable based on the length of the connecting portion 22c in a definitive manner, the removal work of the plug 22 can be easily and simply performed.

The socket 20 includes: the concave portion 20a which opens toward the outside of the circuit board 14, and into which the terminal of the plug is fitted; and the electrode 20b that is exposed in the concave portion 20a. By fitting the terminal 22a of the plug 22 into the concave portion 20a, the terminal 22a of the plug 22 and the electrode 20b of the socket 20 will contact to each other. This means that the plug 22 and the socket 20 are electrically connected.

The connector 18 is arranged on the mounting surface side of the circuit board 14 on which the LEDs 16 are mounted. Here, the length L18 of the connector 18 in an optical axis direction is set to be smaller than the length L16 of the LED 16 in an optical axis direction thereby preventing the connector 18 from any kinds of interference. With this structure, it is possible to make the LEDs 16 mounted on the circuit board 14 closely abutted to the light incident surface 12c of the light guiding plate 12. Accordingly, light incidence efficiency of light that has been emitted from the LEDs 16 and then introduced unto the light guiding plate 12 can be well improved. The region sandwiched between the light incident surface 12c of the light guiding plate 12 and the circuit board 14 can be effectively used as a place on which the connector 18 is mounted, thereby contributing to the downsizing of the spread illuminating apparatus 10.

In the example of FIG. 2, one side end face of the light guiding plate 12 is used as the light incident surface 12c, so that the circuit boards 14 and 14 adjacent to each other are arranged linearly along the light incident surface 12c. On the other hand, in the example of FIG. 3, two side end faces of the light guiding plate 12 arranged to have a predetermined angle (a right angle in FIG. 3) are used as the light incident surfaces 12c and 12c. The circuit boards 14 and 14 adjacent to each other are arranged along these light incident surfaces 12c and 12c at a predetermined angle (90° in FIG. 3). In order to realize the arrangement of FIG. 3, the connecting portion 22c has flexible properties enabling to cope with various arrangement angles. The connection work between the socket 20 and the plug 22 can be thus well facilitated. In this case, the sidewall 24a of the frame 24 should be provided on at least two respective sides, which are orthogonal to each other. Here, preferably the frame 24 has an opened box configuration where sidewall 24a is formed on all respective end faces of the frame 24.

Figure 3:
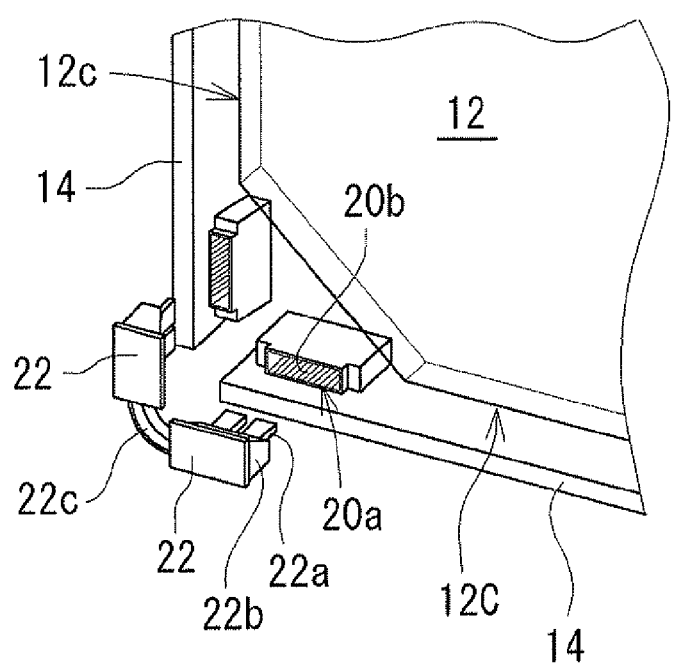
FIG. 3 is a perspective view illustrating another example of the periphery of the connector that eclectically connects the adjacent circuit boards of the spread illuminating apparatus according to the embodiment of the present invention.
Figure 4:
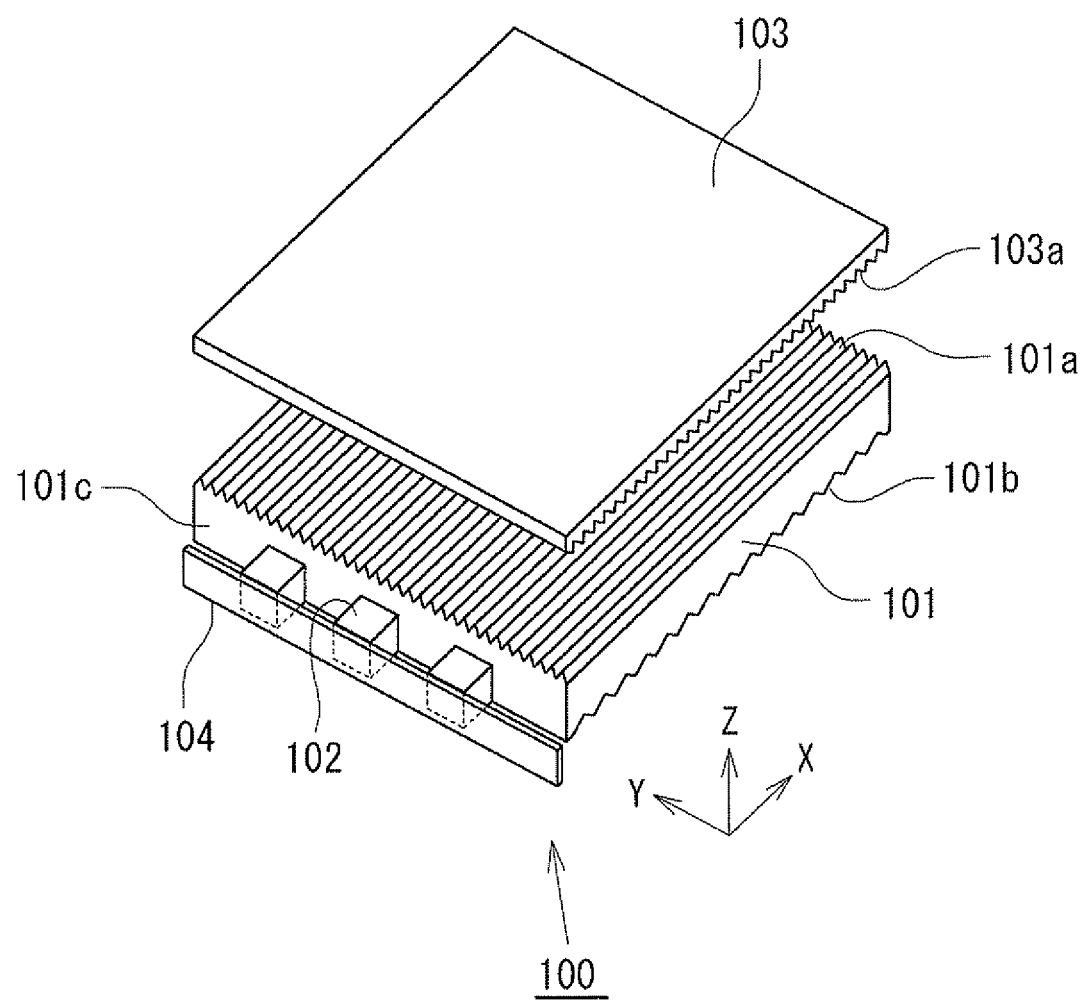
FIG. 4 is a perspective view schematically illustrating one example based on the structure of a conventional sidelight type spread illuminating apparatus.

In the examples of FIGS. 1 to 3, the socket 20 is fixed to the circuit board 14. However, the plug 22 may be fixed to the circuit board 14. In this case, if the pair of sockets 20 and 20 are electrically connected by means of the connecting portion, the same functional effects will be obtainable.

What is claimed is:
1. A sidelight type spread illuminating apparatus comprising:
a light guiding plate;
a plurality of strip-shaped circuit boards arranged so as to face a side end face of the light guiding plate, each of the circuit boards being configured to have a long-extended side and a narrow side;
light sources mounted on the circuit boards; and
a connector that electrically connects the circuit boards adjacent to each other,
wherein the connector includes a socket and a plug that are removable therebetween,
the socket and the plug are configured to be removable in a direction parallel to each mounting surface of the light sources of the circuit boards in a state that either the socket or the plug is fixed to ends of the circuit boards adjacent to each other, and the socket and the plug are configured to be removable relative to each other only in a direction along the narrow side of each of the circuit boards.

2. The spread illuminating apparatus according to claim 1, further comprising:

a frame that is configured to house the light guiding plate and the circuit boards and that has a sidewall parallel to the side end face of the light guiding plate, wherein the circuit boards are arranged and fixed to the sidewall of the frame.

3. The spread illuminating apparatus according to claim 2, wherein the frame has at least two sidewalls that face to each other, the frame thus being in a U-shaped cross-section with an opening, and either the socket or the plug is fixed to the circuit boards being configured to allow the socket and the plug removable relative to each other parallel to a thickness of the light guiding plate and in a direction toward the opening of the frame.

4. The spread illuminating apparatus according to claim 1, wherein a pair of sockets are fixed to the ends of the circuit boards adjacent to each other; a pair of plugs are mounted to the pair of sockets, each of the plugs including a terminal electrically connected to an electrode of each socket, a plug body holding each of the terminals, and a connecting portion electrically connecting each of the terminals held in the plug body.

5. The spread illuminating apparatus according to claim 4, wherein the connecting portion is configured to have a certain length to make an interval between each of the pair of plugs to correspondent to an interval between each of the pair of sockets fixed to the ends of the circuit boards adjacent to each other.

6. The spread illuminating apparatus according to claim 4, wherein the connecting portion is configured to have flexibility.

7. The spread illuminating apparatus according to claim 1, wherein the socket includes: a concave portion that opens toward the outside of a circuit board and is fitted with the terminal of the plug; and the electrode that is exposed in the concave portion.

8. The spread illuminating apparatus according to claim 1, wherein the connector is arranged on a mounting surface side of a circuit board on which a light source is arranged, and an optical axis length of the connector is configured to be smaller than an optical axis length of the light source.

\* \* \* \* \*